United States Patent
Wang et al.

(10) Patent No.: US 10,446,400 B2
(45) Date of Patent: Oct. 15, 2019

(54) METHOD OF FORMING MULTI-THRESHOLD VOLTAGE DEVICES AND DEVICES SO FORMED

(71) Applicant: Samsung Electronics Co., Ltd., Gyeonggi-do (KR)

(72) Inventors: Wei-E Wang, Austin, TX (US); Mark S. Rodder, Dallas, TX (US); Borna J. Obradovic, Leander, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/898,420

(22) Filed: Feb. 16, 2018

(65) Prior Publication Data
US 2019/0122891 A1 Apr. 25, 2019

Related U.S. Application Data

(60) Provisional application No. 62/575,357, filed on Oct. 20, 2017.

(51) Int. Cl.
*H01L 21/28* (2006.01)
*H01L 27/092* (2006.01)
*H01L 21/8238* (2006.01)
*H01L 29/51* (2006.01)
*H01L 29/49* (2006.01)

(52) U.S. Cl.
CPC .. *H01L 21/28158* (2013.01); *H01L 21/28088* (2013.01); *H01L 21/823828* (2013.01); *H01L 21/823857* (2013.01); *H01L 27/092* (2013.01); *H01L 29/513* (2013.01); *H01L 29/517* (2013.01); *H01L 29/4966* (2013.01)

(58) Field of Classification Search
CPC ....... H01L 21/28158; H01L 21/823857; H01L 21/28088; H01L 21/823828; H01L 29/517; H01L 29/4966; H01L 27/092
See application file for complete search history.

(56) References Cited

U.S. PATENT DOCUMENTS

| | | |
|---|---|---|
| 6,846,734 B2 | 1/2005 | Amos et al. |
| 7,855,105 B1 | 12/2010 | Jagannathan et al. |
| 8,212,322 B2 | 7/2012 | Frank et al. |

(Continued)

FOREIGN PATENT DOCUMENTS

TW 201705238 A 2/2017

OTHER PUBLICATIONS

C.-H. Yu, M.-H. Han, H.-W. Cheng, Z.-C. Su, Y. Li, and H. Watanabe, "Statistical simulation of metal-gate work-function fluctuation," SISPAD 2010, pp. 153-156.

(Continued)

*Primary Examiner* — Yosef Gebreyesus
(74) *Attorney, Agent, or Firm* — Van Pelt, Yi & James LLP

(57) ABSTRACT

A method provides a gate structure for a plurality of components of a semiconductor device. A silicate layer is provided. In one aspect, the silicate layer is provided on a channel of a CMOS device. A high dielectric constant layer is provided on the silicate layer. The method also includes providing a work function metal layer on the high dielectric constant layer. A low temperature anneal is performed after the high dielectric constant layer is provided. A contact metal layer is provided on the work function metal layer.

15 Claims, 7 Drawing Sheets

(56) References Cited

U.S. PATENT DOCUMENTS

| | | | |
|---|---|---|---|
| 8,309,447 B2 | 11/2012 | Cheng et al. | |
| 8,772,149 B2 | 7/2014 | Cartier et al. | |
| 8,878,298 B2 | 11/2014 | Chang et al. | |
| 9,425,052 B2 | 8/2016 | Scheiper et al. | |
| 9,666,717 B2 | 5/2017 | Singh et al. | |
| 2006/0022252 A1* | 2/2006 | Doh | H01L 29/513 257/314 |
| 2010/0052063 A1* | 3/2010 | Masuoka | H01L 21/28061 257/369 |
| 2012/0091539 A1* | 4/2012 | Fan | H01L 21/28123 257/401 |
| 2012/0238086 A1* | 9/2012 | Hempel | H01L 21/28185 438/591 |
| 2015/0340362 A1 | 11/2015 | Gerhardt | |
| 2017/0033106 A1 | 2/2017 | Walke et al. | |

OTHER PUBLICATIONS

A. R. Brown, N. M. Idris, J. R. Watling, and A. Asenov, "Impact of Metal Gate Granularity on Threshold Voltage Variablity: A Full-Scale Three-Dimensional Statistical Simulation Study," IEEE Electron Device Lett., Nov. 2010.

T. Matsukawa et al., "Suppressing Vt and Gm variability of FinFETs using amorphous metal gates for 14 nm and beyond," IEDM Symposium 2012, p. 8.2.1-8.2.4.

A. Tarniowy, R. Mania, and M. Rekas, "The effect of thermal treatment on the structure, optical and electrical properties of amorphous titanium nitride thin films," Thin Solid Films, vol. 311, No. 1-2, pp. 93-100, Dec. 1997.

L.-A. Ragnarsson et al., "Zero-thickness multi work function solutions for N7 bulk FinFETs," VLSI Symposium 2016, pp. 1-2.

K. Kita, L. Q. Zhu, T. Nishimura, K. Nagashio, and A. Toriumi, "(Invited) Formation of Dipole Layers at Oxide Interfaces in High-k Gate Stacks," in ECS Transactions, 2010, vol. 33, pp. 463-477.

T. Ando et al., "Understanding mobility mechanisms in extremely scaled HfO2 (EOT 0.42 nm) using remote interfacial layer scavenging technique and Vt-tuning dipoles with gate-first process," presented at the IEDM, 2009, pp. 1-4.

Sioncke et al., "First demonstration of ~3500 cm 2 /V-s electron mobility and sufficient BTI reliability (max Vov up to 0.6V) In0.53Ga0.47As nFET using an iL/LaSiOx/HfO2 gate stack," VLSI Symposium 2017, pp. T38-T39.

H. Arimura et al., "Si-passivated Ge nMOS gate stack with low Dit and dipole-induced superior PBTI reliability using 3D-compatible ALD caps and high-pressure anneal," IEDM Symposium 2016, p. 33.4.1-33.4.4.

Q. Wang et al., "Influence of LaSiOx passivation interlayer on band alignment between PEALD-Al2O3 and 4H-SiC determined by X-ray photoelectron spectroscopy," Appl. Surf. Sci., vol. 428, pp. 1-6, Jan. 2018.

T. Ando, "Ultimate Scaling of High-? Gate Dielectrics: Higher-? or Interfacial Layer Scavenging?," Materials, vol. 5, No. 12, pp. 478-500, Mar. 2012.

L.-A. Ragnarsson et al., "Ultra low-EOT (5 Å) gate-first and gate-last high performance CMOS achieved by gate-electrode optimization," IEDM Symposium 2009, pp. 1-4.

X. Li and A. Toriumi, "Self-decomposition of SiO2 due to Si-chemical potential increase in SiO2 between HfO 2 and substrate—Comprehensive understanding of SiO2-IL scavenging in HfO2 gate stacks on Si, SiGe and SiC," IEDM Symposium 2015, p. 21.4.1-21.4.4.

T. Ando, M. Copel, J. Bruley, M. M. Frank, H. Watanabe, and V. Narayanan, "Physical origins of mobility degradation in extremely scaled SiO2/HfO2 gate stacks with La and Al induced dipoles," Appl. Phys. Lett., vol. 96, No. 13, p. 132904, Mar. 2010.

C. H. Lee et al., "Selective GeOx-scavenging from interfacial layer on Si1-xGex channel for high mobility Si/Si1-xGex CMOS application," VLSI Symposium 2016, pp. 1-2.

H. K. Liou, P. Mei, U. Gennser, and E. S. Yang, "Effects of Ge concentration on SiGe oxidation behavior," Appl. Phys. Lett., vol. 59, No. 10, pp. 1200-1202, Sep. 1991.

J, Kavalieros et al., "Tri-Gate Transistor Architecture with High-k Gate Dielectrics, Metal Gates and Strain Engineering," 2006, pp. 50-51.

J.-P. Colinge, Ed., FinFETs and other multi-gate transistors. New York, NY: Springer, 2008—Part 1.

J.-P. Colinge, Ed., FinFETs and other multi-gate transistors. New York, NY: Springer, 2008—Part 2.

J.-P. Colinge, Ed., FinFETs and other multi-gate transistors. New York, NY: Springer, 2008—Part 3.

J.-P. Colinge, Ed., FinFETs and other multi-gate transistors. New York, NY: Springer, 2008—Part 4.

J.-P. Colinge, Ed., FinFETs and other multi-gate transistors. New York, NY: Springer, 2008—Part 5.

J.-P. Colinge, Ed., FinFETs and other multi-gate transistors. New York, NY: Springer, 2008—Part 6.

J.-P. Colinge, Ed., FinFETs and other multi-gate transistors. New York, NY: Springer, 2008—Part 7.

K.-M. Liu and C.-K. Lee, "Investigation of the random dopant fluctuations in 20-nm bulk mosfets and silicon-on-Insulator FinFETs by Ion implantation Monte Carlo simulation," Nanoelectronics Conference (INEC), 2013, pp. 263-266.

J. Xiang et al., "Investigation of TiAlC by Atomic Layer Deposition as N Type Work Function Metal for FinFET," ECS J. Solid State Sci. Technol., vol. 4, No. 12, pp. P441-P444, 2015.

Yee-Chia Yeo, P. Ranade, Qiang Lu, R. Lin, Tsu-Jae King, and Chenming Hu, "Effects of high-? dielectrics on the workfunctions of metal and silicon gates," IEEE Electron Device Lett, 2001, pp. 49-50.

R. Chau, S. Datta, M. Doczy, B. Doyle, J. Kavalieros, and M. Metz, "High-k/Metal-Gate Stack and Its MOSFET Characteristics," IEEE Electron Device Lett., vol. 25, No. 6, pp. 408-410, Jun. 2004.

M. Kadoshima et al., "Effective-Work-Function Control by Varying the TiN Thickness in Poly-Si/TiN Gate Electrodes for Scaled High-k CMOSFETs," IEEE Electron Device Lett., vol. 30, No. 5, pp. 466-468, May 2009.

K. Choi et al., "The effect of metal thickness, overlayer and high-k surface treatment on the effective work function of metal electrode," Proceedings of ESSDERC, 2005, pp. 101-104.

T. Nabatame, M. Kimura, H, Yamada, A. Ohi, T. Ohishi, and T. Chikyow, "(Invited) Mechanism of Vfb Shift in HfO2 Gate Stack by Al Diffusion from (TaC)1-xAix Gate Electrode," ECS Trans., vol. 45, No. 3, pp. 49-59, Apr. 2012.

M. D. Giles et al., "High sigma measurement of random threshold voltage variation in 14nm Logic FinFET technology," Symposium on VLSI Technology, 2015, pp. T150-T151.

* cited by examiner

METHOD OF FORMING MULTI-THRESHOLD VOLTAGE DEVICES AND DEVICES SO FORMED

CROSS-REFERENCE TO RELATED APPLICATIONS

This application claims the benefit of provisional Patent Application Ser. No. 62/575,357, filed Oct. 20, 2017, entitled "METHOD FOR FORMING MULTI-Vt DEVICES FOR CMOS", assigned to the assignee of the present application, and incorporated herein by reference.

BACKGROUND

For various applications, it may be desirable to provide semiconductor devices in which the component transistors have differing threshold voltages. Such semiconductor devices are termed multi-threshold voltage (multi-Vt) devices. For example, a particular integrated circuit may combine SRAM and logic. SRAM transistors typically require a higher Vt than logic transistors. Low threshold voltage (LVt) transistors may thus be used for logic portions of the semiconductor device, while regular threshold voltage (RVt) transistors may be used for the SRAM portions of the semiconductor device. Consequently, multi-Vt semiconductor devices incorporating transistors having differing Vts are desired.

Conventional methods for providing multi-Vt devices rely heavily on a stack including a reactive work function metal (such as Al and/or Ti) placed on top of a mid-gap work function metal (such as TaN and/or TiN) for tuning Vt of the devices. For example, a stack consisting of TiN/TaN/TiAlC/TiN may be provided on a high dielectric constant layer for use as a transistor gate. The shift in Vt of the transistor depends upon the thicknesses of the layers of stack. The TiN/TaN/TiAlC/TiN stack typically has a large thickness to provide the desired range of Vt. For example, while functional for close to twenty nanometer spacings, the TiN/TaN/TiAlC/TiN stack, placed on top of the a high dielectric constant layer (a few nanometers thick), may start to merge for replacement metal gate (RMG) spacings on the low teens of nanometers.

The current scaling trend in semiconductor devices has rendered a lower RMG spacing for achieving higher device density. Architectures such as fin field effect transistors (finFETs), gate all around FET (GAA-FET) and replacement metal gate FET (RMG-FET) exist to address certain critical issues at scaled nodes, such as the short channel effect (SCE). However, such architectures do not specifically address issues in multi-Vt devices. Although the use of a work function metal stack works very well for current nodes, at lower spacings at extreme scaled nodes, issues arise. As the RMG spacing decreases from scaling, the relatively thick work function metal stack may merge. Stated differently, a work function metal stack that is sufficiently thick to provide the desired shift in Vt may not be capable of fitting into the RMG spacing available given the topology of the underlying surface at extreme scaled nodes. As discussed above, such a stack may start to merge at lower spacings. The variation in Vt (sigma Vt) may also increase as multi-Vt devices are scaled to lower sizes. This is because random variations in the electron work function (eWF) are exacerbated for polycrystalline work function metals at lower sizes.

Mechanisms to shift Vt without increasing the thickness of the work function metal stack and to address variations in eWF exist. However, each method has its drawbacks. Consequently, an improved mechanism for controlling the threshold voltage of a multi-Vt semiconductor device is desired.

BRIEF SUMMARY OF THE INVENTION

A method provides a gate structure for a plurality of components of a semiconductor device. A silicate layer is provided. In one aspect, the silicate layer is provided on a channel of a CMOS device. A high dielectric constant layer is provided on the silicate layer. The method also includes providing a work function metal layer on the high dielectric constant layer. A low temperature anneal is performed after the work function metal layer is provided. A contact metal layer is provided on the work function metal layer.

The method described herein may provide shifts in the threshold voltage of a transistor by changing the thickness of the silicate layer by not more than one nanometer. In some embodiments, differences in thickness of a few Angstroms may result in threshold voltage shifts of tens of millivolts or larger. Consequently, multi-Vt transistors may be provided at more extreme scaled nodes.

DETAILED DESCRIPTION OF THE INVENTION

Figure 1:
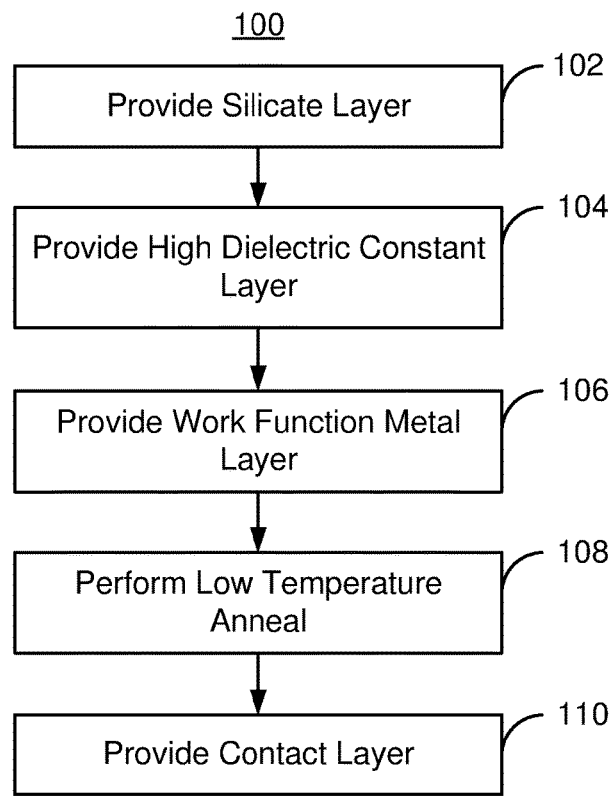
FIG. 1 is a flow chart depicting an exemplary embodiment of a method for providing a multi-Vt gate structure in a semiconductor device.

The exemplary embodiments relate to formation of multi-Vt semiconductor devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A method provides a gate structure for a plurality of components of a semiconductor device. A silicate layer is provided. In one aspect, the silicate layer is provided on a channel of a CMOS device. A high dielectric constant layer is provided on the silicate layer. The method also includes providing a work function metal layer on the high dielectric constant layer. A low temperature anneal is performed after the work function metal layer is provided. A contact metal layer is provided on the work function metal layer.

Figure 2A:
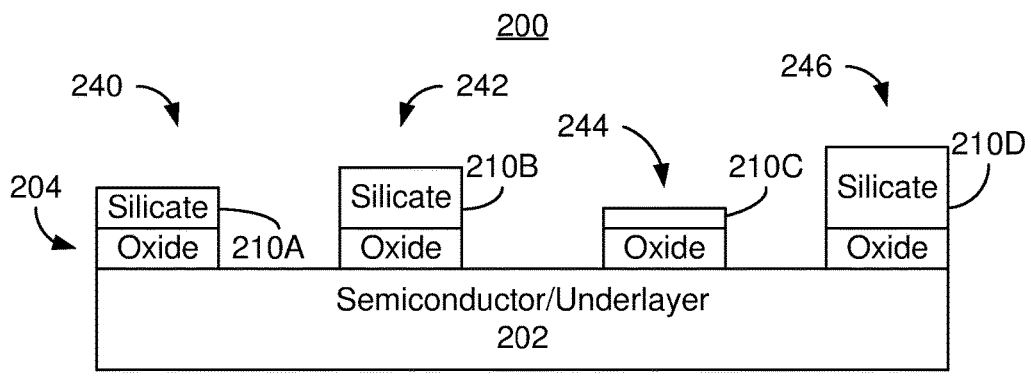
FIGS. 2A-2C depict portions of an exemplary embodiment of a gate structures during fabrication.
Figure 2B:
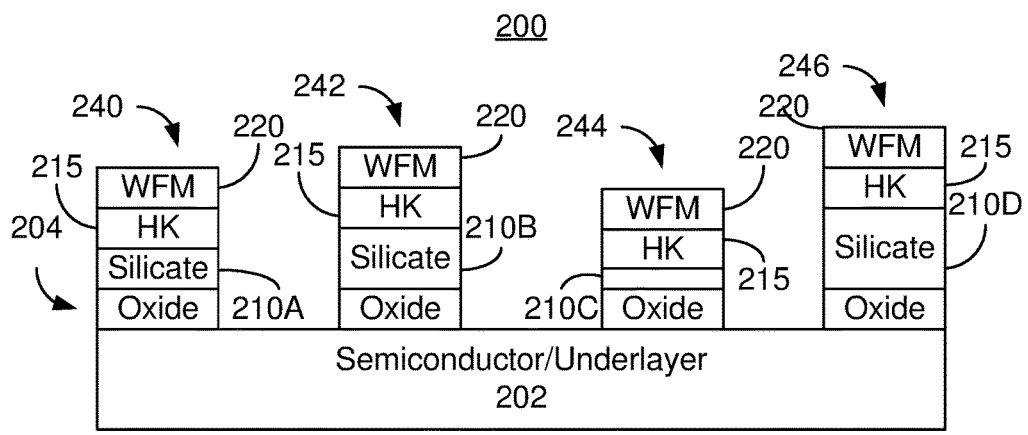
Figure 2C:
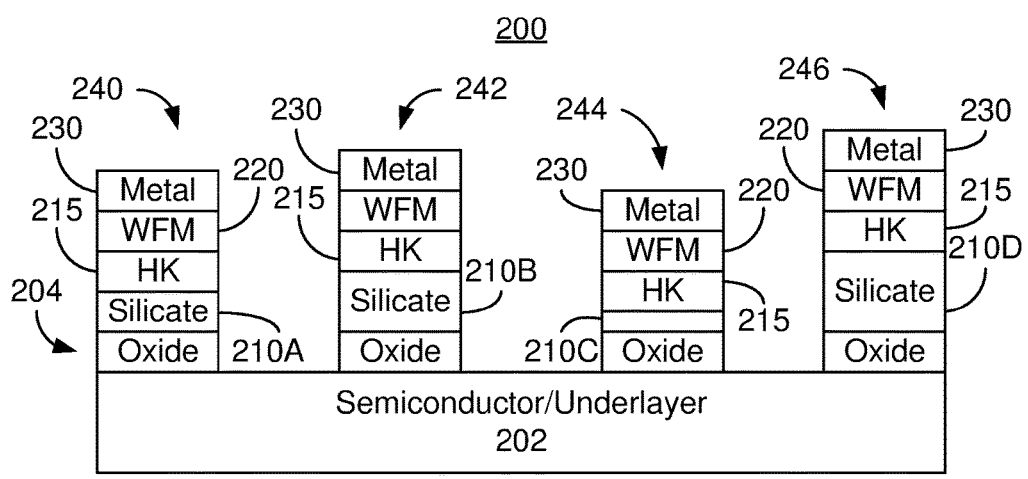

FIG. 1 is a flow chart depicting an exemplary embodiment of a method 100 for providing a gate structure for components, i.e. transistors, in a semiconductor device. For simplicity, some steps may be omitted, performed in another order and/or combined. Further, the method 100 may start after other steps in forming the semiconductor device have been performed. For example, the method may start after source and drain regions have been defined and various structures provided. FIGS. 2A-2C depict portions of an exemplary embodiment of a semiconductor device 200, such as a MOS device, during fabrication of the gate structures using the method 100. For simplicity, not all components are shown in FIGS. 2A-2C and FIGS. 2A-2C are not to scale. For example, various structures that may have been formed prior to the gate structure are not shown. Further, the thickness of the layers may be exaggerated for explanatory purposes. The method 100 is described in the context of the semiconductor device 200. However, nothing prevents the method 100 from being used with a different semiconductor device.

A silicate layer is provided on the underlying layer, via step 102. In some embodiments, an interfacial oxide layer, such as $SiO_2$, has formed prior to deposition of the silicate layer. The silicate layer deposited in step 102 is used in formation of dipoles, discussed below, which are effective in shifting the threshold voltage, Vt, of the component being formed. For example, the silicate layer provided in step 102 may have a total thickness that does not exceed two nanometers. In some embodiments, the thickness of the silicate layer is at least 0.1 nm and not more than one nanometer. Thicknesses in this range (one through ten Angstroms) may be sufficient to shift the Vt of the device being fabricated by up to hundreds of millivolts. Stated differently, a very small change in thickness of the silicate layer results in a noticeable change in Vt. Consequently, tailoring the thickness of the silicate layer provided in step 102 provides an effective mechanism for setting the Vt of the devices being fabricated to the desired levels. Thus, the silicate layer provided in step 102 may be thicker for some components, thinner for some components and/or absent for other components based on the desired Vt.

The materials used in silicate layer provided in step 102 may be selected from among various silicates. For example, the silicate layer may include one or more of $LuSiOx$, $YSiOx$, $LaSiOx$, $BaSiOx$, $SrSiOx$, $AlSiOx$, $TiSiOx$, $HfSiOx$, $ZrSiOx$, $TaSiOx$, $ScSiOx$, $MgSiOx$, $LuSiOx$, $YSiOx$, $LaSiOx$, $BaSiOx$, $SrSiOx$, $AlSiOx$, $TiSiOx$, $HfSiOx$, $ZrSiOx$, $TaSiOx$, $ScSiOx$ and $MgSiOx$, where Ox indicates an oxide with a varying stoichiometry. Further, the silicon content in each silicate layer may be varied, for example, from zero to not more than seventy atomic percent. The silicon content in the silicate may be used to tailor the shift in Vt. The material selected depends upon the sign of the voltage shift desired and the designated devices (i.e., nFETs or pFETs) being formed. If the component being fabricated is an nFET and Vt is desired to be shifted downwards (negatively) then in some embodiments, the silicate provided in step 102 may include one or more of $LuSiOx$, $YSiOx$, $LaSiOx$, $BaSiOx$ and $SrSiOx$. If the component being fabricated is an nFET and Vt is desired to be shifted upwards (positively) then the silicate provided in step 102 may include at least one of $AlSiOx$, $TiSiOx$, $HfSiOx$, $ZrSiOx$, $TaSiOx$, $ScSiOx$ and $MgSiOx$. If the component being fabricated is a pFET and Vt is desired to be shifted upwards, then the silicate provided in step 102 may include at least one of $LuSiOx$, $YSiOx$, $LaSiOx$, $BaSiOx$ and $SrSiOx$. If the component being provided is a p-FET and Vt is desired to be shifted downwards, then the silicate provided in step 102 may include one or more of $AlSiOx$, $TiSiOx$, $HfSiOx$, $ZrSiOx$, $TaSiOx$, $ScSiOx$ and $MgSiOx$. Other silicates may be used to shift the voltage up or down in other embodiments. Thus, by selection of the appropriate silicate and configuring the thickness of the silicate, desired shift in Vt may be obtained.

The thickness of the silicate layer provided in step 102 varies for different regions/components being fabricated on the semiconductor devices. This may be accomplished through multiple depositions and etches of sublayers of silicates. In some embodiments, the sublayers are all formed of the same silicate. In other embodiments, sublayers may be formed of different silicates if desired. However, the total thickness of the silicate layer is in the range described above.

FIG. 2A depicts the semiconductor device 200 after step 102 is performed. For simplicity, the layers are depicted as being only in regions in which components are to be formed and other structures such as spacers, interconnects or other features are not shown. However, some or all of the layers may extend beyond the devices being fabricated. The layers are also depicted as being planar. However, in some embodiments, the layers may be three dimensional, for example if the underlying structure is a semiconductor fin. Also, as previously mentioned, the thicknesses and other dimensions shown in FIGS. 2A-2C are not to scale.

Components 240, 242, 244 and 246 are being fabricated and may each be a transistor. For example, each of the components 240, 242, 244 and 246 may be a gate all around field effect transistor (FET) or a replacement metal gate FET. In some embodiments, all of the transistors on the semiconductor device 200 may include dipoles. In other embodiments, some transistors (not shown) may not include the dipoles described herein. The underlying semiconductor 202 is shown. In some embodiments, the semiconductor 202 is Si. In other embodiments, other substrates including but not limited to SiGe, SOI, sSOI, SGOI, sSGOI and analogous substrates that allow for a natural SiOx formation. Also depicted is interfacial oxide 204. In some embodiments, the interfacial oxide 204 is silicon dioxide. Silicate layer 210 having portions 210A, 210B, 210C and 210D have been provided. The transistors 240, 242, 244 and 246 include silicate layers 210A, 210B, 210C and 210D, respectively, of different thicknesses. Consequently, components 240, 242, 244 and 246 should have different Vt shifts.

After the silicate layer 210 has been formed, a high dielectric constant (high K) layer is provided on the silicate layer 210, via step 104. For example, a layer of HfOx may be formed in step 104. In some embodiments, formation of the high K layer may be carried out at temperatures of at two hundred degrees Celsius and not more than six hundred degrees Celsius.

A work function metal layer is provided on the high dielectric constant layer, via step 106. Although all metals can be characterized by a work function, the layer is termed a work function metal layer because the electron work function (eWF) for the metal is a factor in determining Vt for the devices being formed. For example, the work function metal layer may include at least one of TiN, TaN, TiSiN, TiTaN, WN and TiTaSiN. Other metals may be used in other embodiments. The work function metal is also relatively thin. For example, the work function metal thickness may be not more than three nanometers. FIG. 2B depicts the semiconductor device 200 after step 106 has been performed. Thus, work function metal (WFM in FIG. 2B) layer 220 and high dielectric constant (HK) layer 215 are shown for all devices 240, 242, 244 and 246.

A low temperature anneal is performed after HK layer 215 and work function metal layer 220 have been formed, via step 108. The low temperature anneal may be used to homogenize the mixing of the silicate layer 210 and the high dielectric constant layer 215 at the interface. In addition, the anneal may aid in controlling the final Vt. Step 108 may include performing an anneal at an anneal temperature of at least two hundred degrees Celsius and not more than eight hundred degrees Celsius. In some embodiments, the maximum anneal temperature is not more than six hundred degrees Celsius. In some embodiments, the anneal temperature is at least four hundred degrees Celsius. In some such embodiments, the temperature of the anneal is at least five hundred degrees Celsius.

In some embodiments, the anneal in step 108 is performed with a sacrificial reactive metal layer (not shown in FIGS. 2A-2C). Such a reactive metal layer would generally be removed after the anneal. The reactive metal layer may include one or more of Si, Ti, Zr, Hf and La and may have thickness of not more than four nanometers. Other materials and other thicknesses may be used. Such a metal may be used on one or more of the components 240, 242, 244 and 246 during the anneal for additional control in the final threshold voltage. Alternatively, such a reactive metal layer might be omitted from some or all of the components 240, 242, 244 and 246.

A contact metal layer is then provided on the work function metal layer, via step 110. In some embodiments, the contact metal layer may be W or Co. However, other metals may be used in other embodiments. FIG. 2C depicts the semiconductor device 200 after step 110 has been performed. Consequently, metal contacts 230 have been provided for each of the devices 240, 242, 244 and 246 being formed. Fabrication of the semiconductor device 200 may then be completed.

Using the method 100, the Vt of the transistors 240, 242, 244 and 246 may be separately tuned, such that the semiconductor device 200 is a multi-Vt device. The work function metal 220 used in the transistors 240, 242, 244 and 246 sets baseline Vt for each of the transistors 240, 24, 244 and 246. The dipoles formed using the silicate layers 210A, 210B. 210C and 210D may shifts the baseline Vt up or down, depending upon the thickness of the silicate layers 210A, 210B, 210C and 210D and the materials used. Assuming the same silicate is used for all components 240, 242, 244 and 246, the transistor 246 has the largest shift, the transistor 242 a middle range shift, transistor 240 a smaller shift and transistor 244 the smallest shift. As discussed above, use of a sacrificial reactive metal layer during the low temperature anneal may provide fine adjustments to the Vt. Thus, a multi-Vt semiconductor device 200 may be provided.

The semiconductor device 200 and method 100 are appropriate for significantly smaller devices. As indicated above, the work function metal layer 220 has a maximum thickness of approximately three nanometers in some embodiments. This thickness is significantly less than the total thickness of a work function metal stack such as TiN/TaN/TiAlC/TiN. This layer 220 provides the baseline Vt. Shifts in the Vt may be provided using the silicate layer 210. The thickness for the silicate layer 210 and the high dielectric constant layer 215 combination can be less than two nanometers. In some embodiments, the silicate layer 210 thickness may be at least 0.1 nanometer and not more than one nanometer for all of the components 240, 242 and 246. Variations in thickness of the silicate layer 210 of less than one nanometer may provide significant shifts in the baseline Vt. For example, a difference in the silicate layer thickness on the order of a few Angstroms between components 242 and 246 may produce a Vt difference of a hundred millivolts or more. Thus, a multi-Vt device 200 may be provided without requiring a large total thickness of the stack of layers 210, 215, 220 and 230. Using the method 100, a multi-Vt device 200 consistent with RMG spacings on the order of seven to eight nanometers or less may be fabricated. The stack may also be sufficiently thin that remaining space can be used for contact metal fills. This may reduce resistivity. Other technologies with small spacing and/or larger RMG spacings can readily be fabricated using the method 100. Thus, the method 100 may provide multi-Vt devices 200 that can be scaled to significantly smaller sizes.

The method 100 may also improve manufacturability. The stack used for the components 240, 242, 244 and 246 does not contain aluminum in at least some embodiments. Consequently, aluminum-related highly temperature sensitive issues may be avoided. A small variation (e.g., a few percent) of Si (from ALD process and from silicon up-diffusion) may not significantly alter the magnitude of dipole voltage set by silicate layer 210. This is because the band offset has been fixed by the bulk La and Si content e.g. from LaSiOx. In contrast, slight aluminium diffusion into a $HfO_2$ high dielectric constant layer, for example in the amount of 0.1%, can alter Vt significantly from the target value. Silicates such as LaSiOx deposited at low temperatures around 300 C are naturally amorphous. The dipole voltage induced may not have crystalline orientation dependency. This implies that local sigma Vt issues from the thick, conventional stack may be mitigated or avoided. Thus, the method 100 and multi-Vt device 200 have improved performance and manufacturability, particularly at smaller device sizes.

Figure 3:
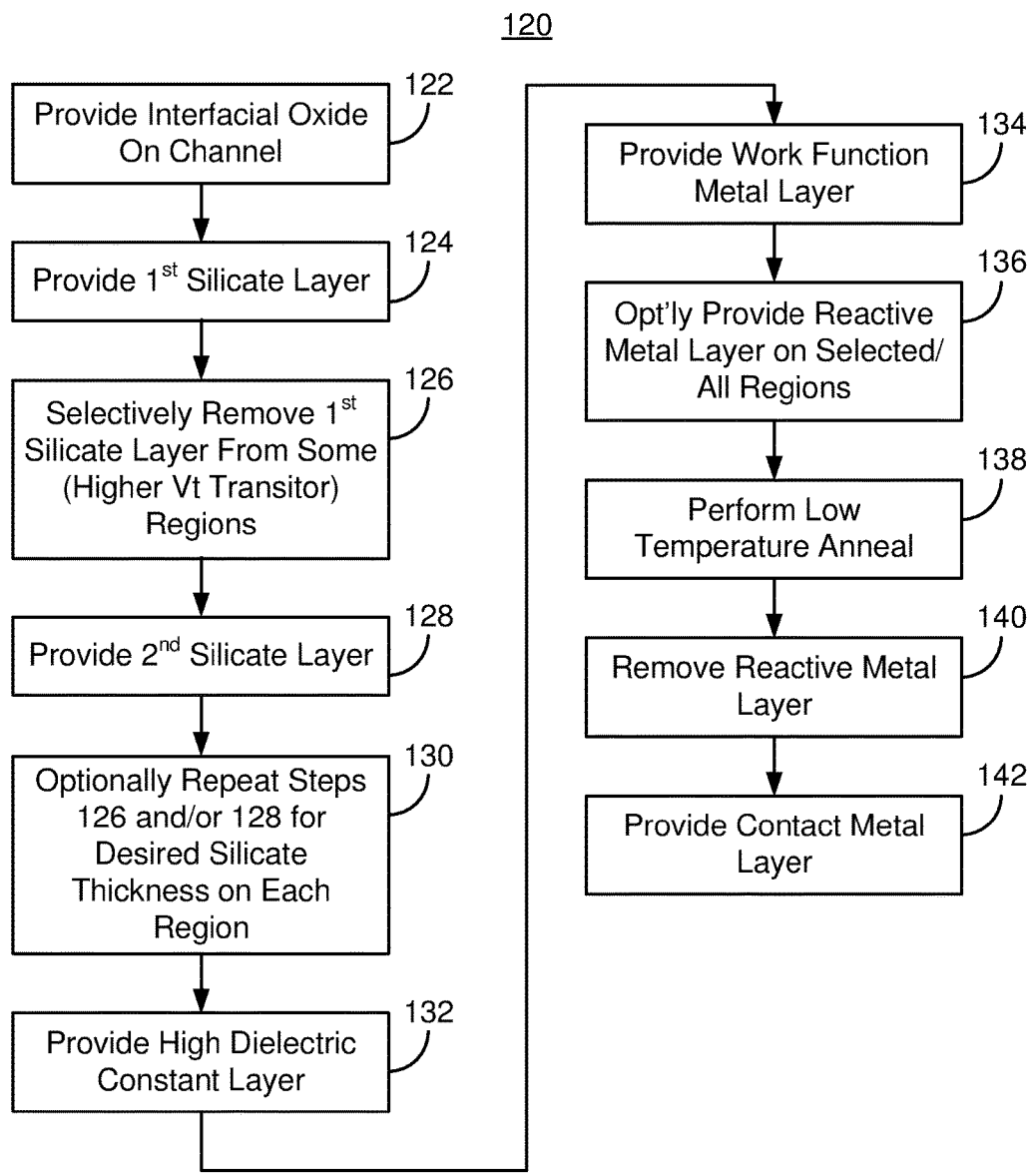
FIG. 3 is a flow chart depicting an exemplary embodiment of a method for providing a multi-Vt transistors in a semiconductor device.

FIG. 3 is a flow chart depicting an exemplary embodiment of a method 120 for providing a gate structure for transistors in a multi-Vt semiconductor device. For simplicity, some steps may be omitted, performed in another order and/or combined. Further, the method 120 may start after other steps in forming the semiconductor device have been performed. For example, the method may start after source and drain regions have been defined and various structures provided. FIGS. 4-13 depict portions of an exemplary embodiment of a semiconductor device 250, such as a MOS device, during fabrication of the gate structures using the method 100. For simplicity, not all components are shown in FIGS. 4-13 and FIGS. 4-13 are not to scale. For example, various structures that may have been formed prior to the gate structure are not shown. Further, the thickness of the layers may be exaggerated for explanatory purposes. For clarity, only the structures in the region of the transistors being formed are shown. Thus, the underlying topology has not been indicated. The transistors formed are not, however, limited to planar transistors. Instead, the method 120 may be incorporated into other architectures including but not limited to FinFETs, GAA-FETS and RMG-FETs. The method 120 is described in the context of the semiconductor device 250. However, nothing prevents the method 120 from being used with a different semiconductor device.

A thin interfacial oxide layer is formed on the channel regions, via step 122. The interfacial oxide may include SiOx and may be naturally formed on the channel. In some embodiments, the semiconductor is selected from Si, SiGe, SOI, sSOI, SGOI, sSGOI and analogous substrates that allow for a natural SiOx formation.

A first silicate layer is provided on the channel, via step 124. The silicate layer provided in step 124 has a total thickness that does not exceed two nanometers. In some embodiments, the thickness of the silicate layer is at least 0.1 nm and not more than one nanometer. Because the method 120 utilizes multiple silicate layers, the thickness of the layer provided in step 124 may be on the lower end of this range. The materials used in the first silicate layer provided in step 124 may be selected from among various silicates. For example, the silicate layer may include one or more of LuSiOx, YSiOx, LaSiOx, BaSiOx, SrSiOx, AlSiOx, TiSiOx, HfSiOx, ZrSiOx, TaSiOx, ScSiOx, MgSiOx, LuSiOx, YSiOx, LaSiOx, BaSiOx, SrSiOx, AlSiOx, TiSiOx, HfSiOx, ZrSiOx, TaSiOx, ScSiOx and MgSiOx. Further, the silicon content in each silicate layer may be varied to control the maximum shift in Vt. For example, the silicon content may range from zero to not more than seventy atomic percent. The material selected depends upon the sign of the voltage shift desired and the conductivity type of the device being formed in a manner discussed above with respect to the method 100.

Figure 4:
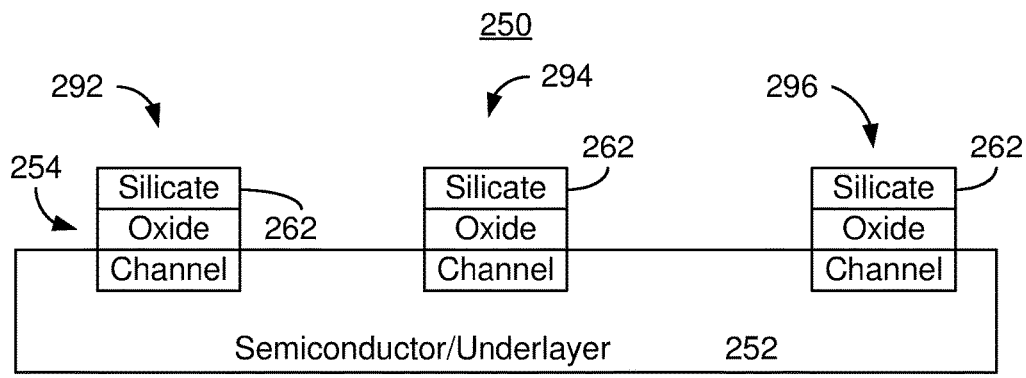
FIGS. 4-13 depict portions of an exemplary embodiment of a multi-Vt semiconductor device during fabrication.

FIG. 4 depicts the semiconductor device 250 after step 124 is performed. Transistors 292, 294 and 296 are being fabricated and may each be a transistor. The underlying semiconductor 252 is shown. Also depicted is interfacial oxide 254. First silicate layer 262 has been provided and is shown on transistors 292, 294 and 296.

Figure 5:
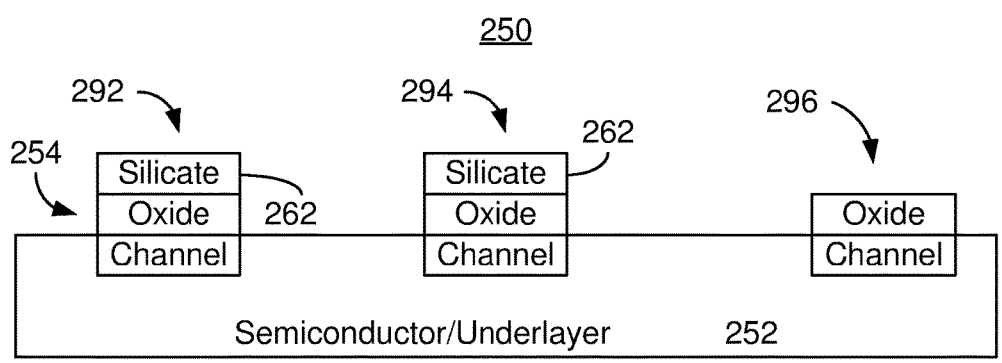

Because the transistors 292, 294 and 296 are desired to have different Vts, the first silicate layer 262 is selectively removed from some components, via step 126. Step 126 includes providing a mask covering regions where the first silicate layer 262 is desired to be preserved. The first silicate layer is then removed from the exposed regions and the mask removed. FIG. 5 depicts the semiconductor device 250 after step 126 is performed. The first silicate layer 262 remains on transistors 292 and 294, but has been removed from transistor 296.

Figure 6:
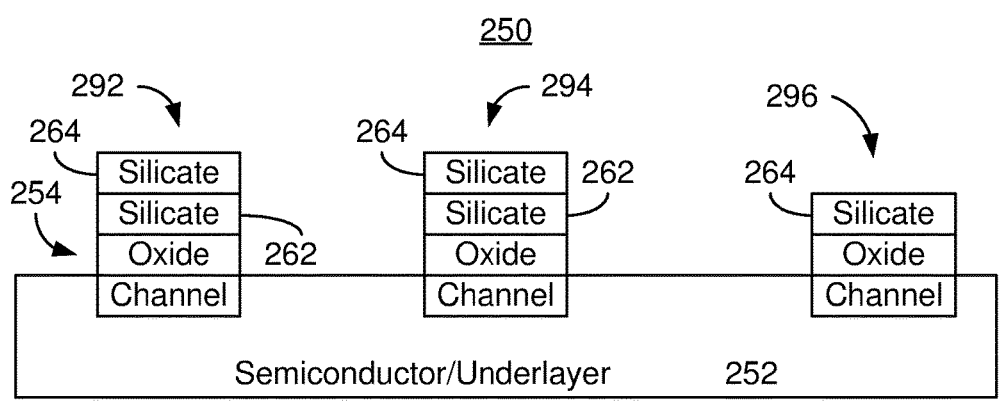

A second silicate layer is provided on the channel, via step 128. The material(s) and thickness of the second silicate layer are selected in an analogous manner to those for the first silicate layer 262. In some embodiments, the same material(s) and thickness are used. In other embodiments, one or both could differ. FIG. 6 depicts the semiconductor device 250 after step 128 is performed. Thus, a second silicate layer 264 has been provided on transistors 292, 294 and 296.

The removal and silicate layer deposition steps 106 and 108 may optionally be repeated, via step 130. Consequently, silicate layers having the desired thicknesses are build up on the transistors 292, 294 and 296. This allows a variety of Vts to be set for the semiconductor device 250. Also, although deposition/mask/removal steps are described herein, in an alternate embodiment, these could be replaced by mask/ deposition steps so that the silicate layer is selectively deposited on the desired regions of the semiconductor device 250.

Figure 7:
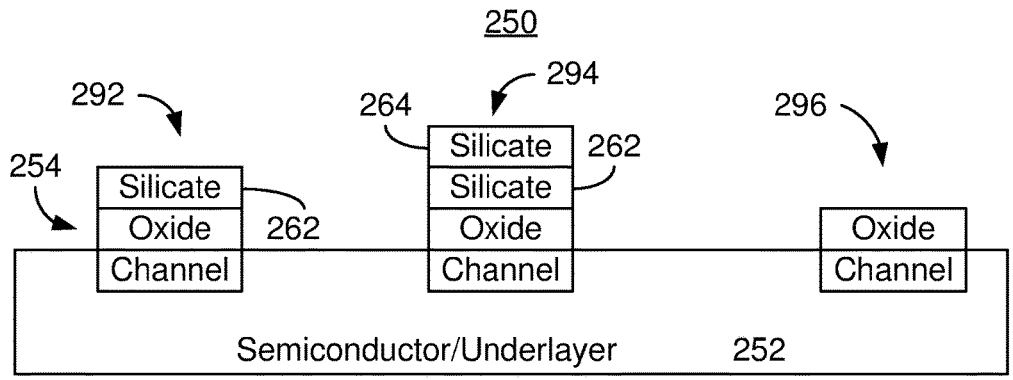
Figure 8:
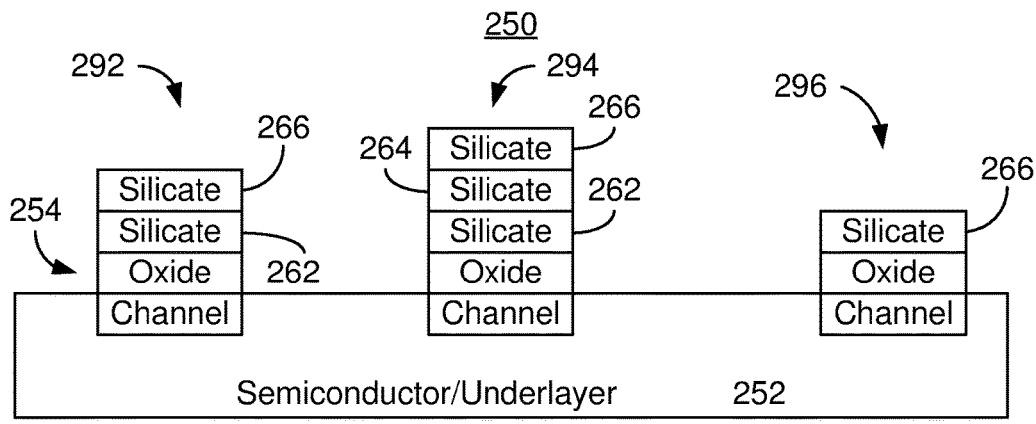

FIG. 7 depicts the semiconductor device 250 after one iteration of step 130 has been completed. A comparison of FIG. 6 and FIG. 7 indicates that the second silicate layer 264 has been removed from the transistors 292 and 296. Thus, each transistor 292, 294 and 296 has a different thickness of silicate layer. Transistor 296 has no silicate layer (e.g. a zero thickness), transistor 292 has a thinner silicate layer 262 and transistor 294 has a thicker silicate layer 262/264. FIG. 8 depicts the semiconductor device 250 after another iteration of step 130 has been completed. Consequently, silicate layer 266 has been provided on each of the devices 292, 294 and 296. The shift in the Vt is based upon the thickness of the silicate layer of the transistor. Thus, transistor 296 has the smallest magnitude shift (thin silicate layer 266). Transistor 292 has an intermediate magnitude shift (thicker of silicate layer 262/266 formed by first silicate layer 262 and third silicate layer 266). Transistor 294 has the largest magnitude shift (thickest silicate layer 262/264/266 formed of first silicate layer 262, second silicate layer 264 and third silicate layer 266). The steps 124, 126, 128 and 130 are analogous to the step 102 of the method 100.

Figure 9:
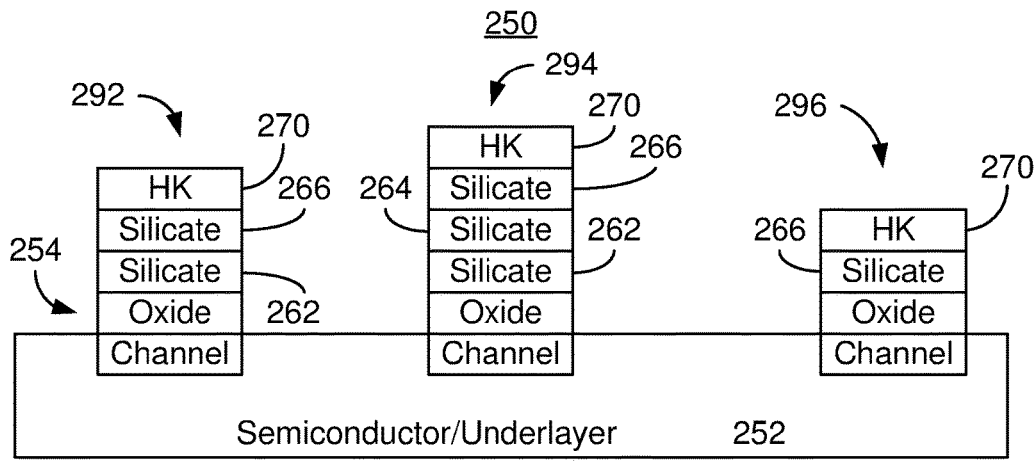

A high dielectric constant layer is provided on the silicate layers previously formed, via step 132. For example, a layer of HfOx may be formed in step 132. In some embodiments, formation of the high dielectric constant layer may be carried out at temperatures of at two hundred degrees Celsius and not more than six hundred degrees Celsius. In some embodiments, formation of the high dielectric constant layer may be at temperatures not exceeding three hundred degrees Celsius. FIG. 9 depicts the semiconductor device 250 after step 132. Thus, the high dielectric constant layer (HK) 270 is shown on transistors 292, 294 and 296.

Figure 10:
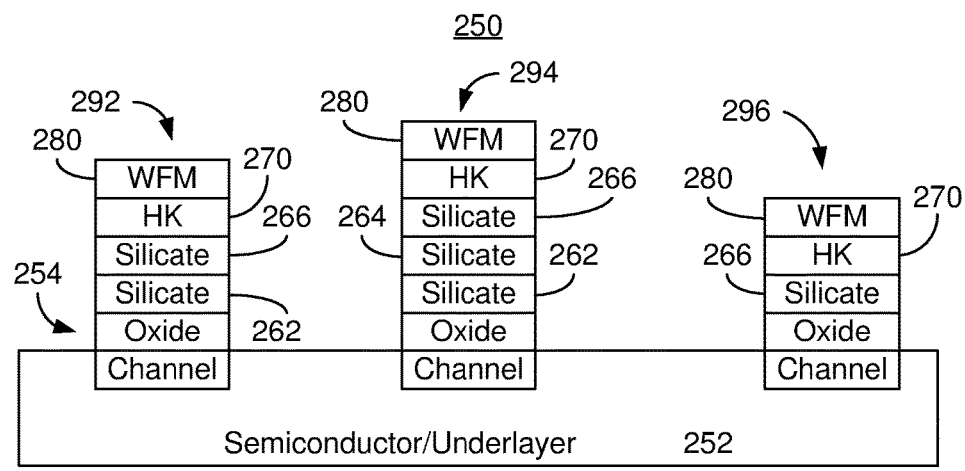

A work function metal layer is provided on the high dielectric constant layer, via step 134. For example, the work function metal layer may include at least one of TiN, TaN, TiSiN, TiTaN, WN and TiTaSiN. Other metals may be used in other embodiments. The work function metal is also relatively thin. For example, the work function metal thickness of not more than three nanometers. FIG. 10 depicts the semiconductor device 250 after step 134 has been performed. Thus, work function metal (WFM) layer 280 has been formed on transistors 292, 294 and 296.

Figure 11:
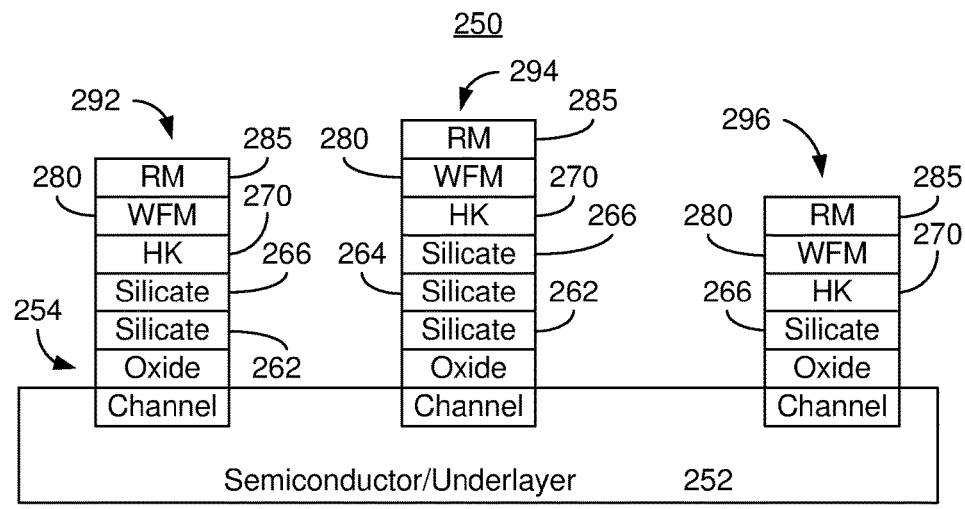

A sacrificial reactive metal layer is provided, via step 136. The reactive metal layer may include one or more of Si, Ti, Zr, Hf and La and may have a thickness of not more than four nanometers. Other materials and other thicknesses may be used. Such a metal may be used during the anneal for additional control in the final threshold voltage. Stated differently, the reactive metal layer provided in step 136 provides fine control over the shift in Vt. FIG. 11 depicts the multi-Vt semiconductor device 250 after step 136 is performed. Thus, the reactive metal layer (RM) 285 has been provided. In the embodiment shown, the reactive metal layer 285 is on all of the transistors 292, 294 and 296. In other embodiments, the reactive metal layer 285 may be omitted from some or all of the transistors 292, 294 and 296.

A low temperature anneal is, via step 138. The low temperature anneal may be used to homogenize the mixing of the silicate layer(s) 262/264/266 and the high dielectric constant layer 270. Step 138 may include performing an anneal at an anneal temperature of at least two hundred degrees Celsius and not more than eight hundred degrees Celsius. In some embodiments, the maximum anneal temperature is not more than six hundred degrees Celsius. In some such embodiments, the temperature of the anneal is at least four hundred degrees Celsius.

In addition to the benefits discussed above, the anneal performed in step 138 may improve the dipole modulation of the Vt of the transistors 292, 294 and 296 due to the use of the reactive metal layer 285. Reactive metals are oxygen getters, allowing such materials to scavenge oxygen atoms out of the underlying oxygen-containing layers during the anneal. The oxygen atoms can then redistribute among the layers, including the work function metal layer 280. This results in modulation of oxygen related dipoles around the high dielectric constant layer/work function metal layer interface, the high dielectric constant layer/silicate layer interface and the silicate/native oxide SiOx interface. A change in the thickness of interfacial oxide layer may also occur. The extent of the modulation is a function of the thickness of work function metal layer 280, the thickness of the reactive metal layer 285 and the anneal temperature. The result is that the Vt may be further modulated in the tens of millivolt range. This scavenging phenomenon can happen even at medium and/or low temperatures around approximately 500-600 degrees Celsius. Stated differently, the scavenging may occur at temperatures used in the anneal of step 138. Thus, the Vt of the transistors 292, 294 and 296 may be shifted both due to the presence of the silicate layers 262/264/266 and the use of the reactive metal layer 285.

Figure 12:
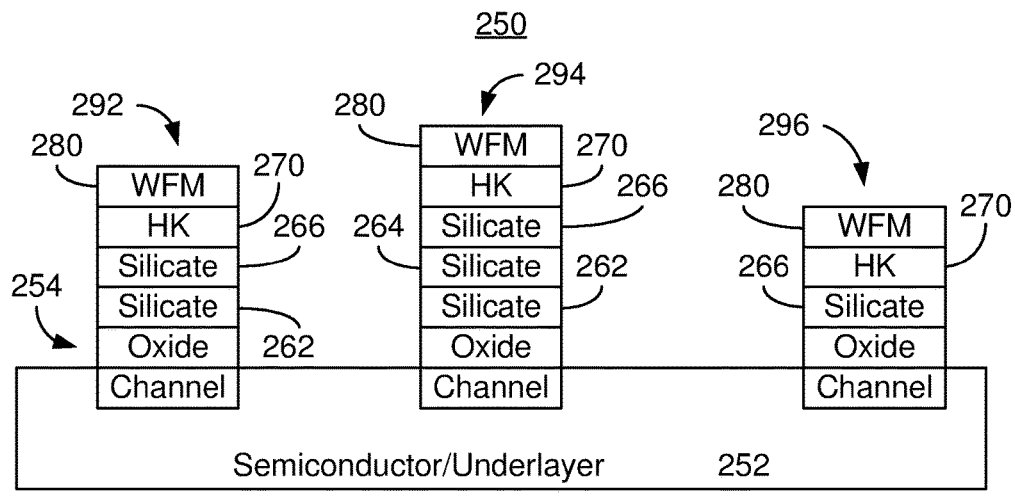
Figure 13:
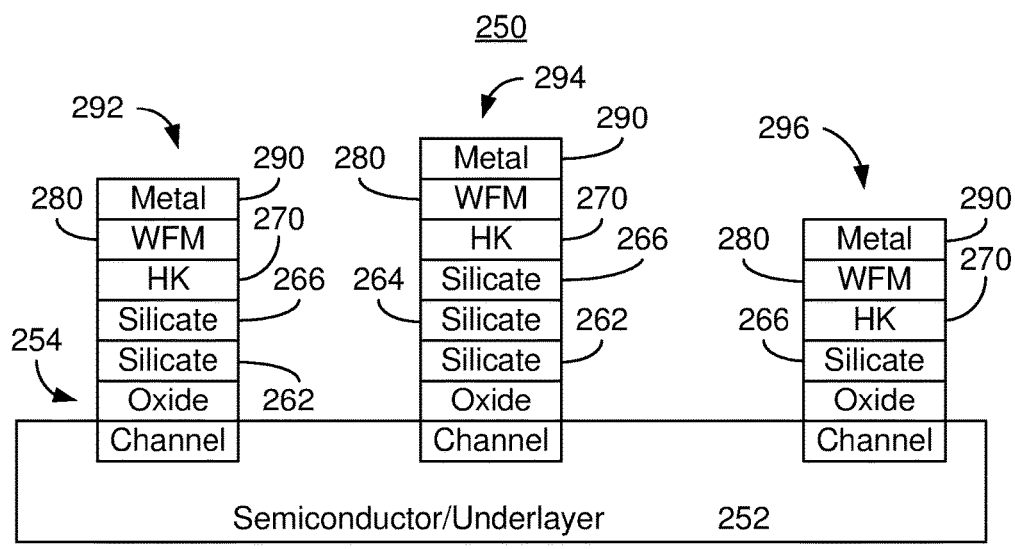

The reactive metal layer 285 is removed, via step 140. FIG. 12 depicts the semiconductor device 250 after removal of the reactive metal layer 285. A contact metal layer is then provided on the work function metal layer, via step 142. In some embodiments, the contact metal layer may be W or Co. However, other metals may be used in other embodiments. FIG. 13 depicts the semiconductor device 250 after step 142 has been performed. Consequently, metal contacts 290 have been provided for each of the devices 292, 294 and 296 being formed. Fabrication of the semiconductor device 250 may then be completed.

The method 120 and semiconductor device 250 may share the benefits of the method 100 and semiconductor device 200. Using the method 120, the Vt of the transistors 292, 294 and 296 may be separately tuned to provide a multi-Vt semiconductor device 250. The work function metal 270 sets baseline Vt for each of the transistors 292, 294 and 296. The dipoles formed using the silicate layers 262/264/266 may shifts the baseline Vt up or down, depending upon the thickness of the silicate layers 262/264/266 and the materials used. Assuming the same silicate is used for all components, the transistor 294 has the largest shift. The transistor 292 has a smaller shift. Transistor 296 has the smallest shift. Use of a sacrificial reactive metal layer during the low temperature anneal may provide fine adjustments to the Vt. Thus, a multi-Vt semiconductor device 250 may be provided.

The semiconductor device 250 and method 120 are appropriate for significantly smaller devices. The thickness of the stack used may be dramatically decreased, while still allowing for a significant variation in Vt between transistors. The method 120 may thus be used on smaller devices without concern that the stack merges. Materials such as Al need not be used in the process 120, which may avoid aluminum-related temperature issues. Thus, the method 120 may provide multi-Vt devices 250 that can be scaled to significantly smaller sizes.

A method and system for providing multi-Vt semiconductor devices have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a gate structure for a plurality of components of a semiconductor device, the method comprising:
   providing a silicate layer, the silicate layer including at least one of LuSiOx, YSiOx, LaSiOx, BaSiOx, SrSiOx, AlSiOx, TiSiOx, ZrSiOx, TaSiOx, ScSiOx and MgSiOx;
   providing a high dielectric constant layer on the silicate layer;
   providing a work function metal layer on the high dielectric constant layer;
   performing a low temperature anneal after the step of providing the high dielectric constant layer; and
   providing a contact metal layer on the work function metal layer.

2. The method of claim 1 wherein the high dielectric constant layer has a dielectric constant greater than a silicon dioxide dielectric constant.

3. The method of claim 1 further comprising:
   providing an interfacial oxide layer before the step of providing the silicate layer.

4. A method for providing a gate structure for a plurality of components of a semiconductor device, the method comprising
   providing a silicate layer, wherein a first portion of the plurality of components has a first thickness of the silicate layer and wherein a second portion of the plurality of components has a second thickness of the silicate layer, the second thickness being different from the first thickness, the step of providing the silicate layer further comprising
      depositing a first silicate layer on at least the first portion and the second portion of the plurality of components;
      removing at least a portion of the first silicate layer from the first portion of the plurality of components; and
      providing a second silicate layer on the first portion and the second portion of the plurality of components;
   providing a high dielectric constant layer on the silicate layer;
   providing a work function metal layer on the high dielectric constant layer;
   performing a low temperature anneal after the step of providing the high dielectric constant layer; and providing a contact metal layer on the work function metal layer.

5. The method of claim 4 wherein the first thickness and the second thickness are each less than two nanometers.

6. The method of claim 5 wherein the first thickness and the second thickness are each not more than one nanometer and at least 0.1 nanometer.

7. The method of claim 4 wherein each of the first silicate layer and the second silicate layer includes at least one of LuSiOx, YSiOx, LaSiOx, BaSiOx, SrSiOx, AlSiOx, TiSiOx, HfSiOx, ZrSiOx, TaSiOx, ScSiOx and MgSiOx.

8. The method of claim 4 wherein a third portion of the plurality of components has a third thickness of the silicate layer, the third thickness being different from the first thickness and different from the second thickness, the step of providing the silicate layer further comprising:
 depositing a third silicate layer on at least the first portion, the second portion and the third portion of the plurality of components;
 removing at least a portion of the third silicon layer from the first portion and the second portion of the plurality of components;
 wherein the step of depositing the first silicate layer includes depositing the first silicate layer on the third portion of the plurality of components;
 wherein the step of removing the at least a portion of the first silicate layer from the first portion of the plurality of components is performed such that the first silicate layer remains on the third portion of the plurality of components; and
 wherein the step of providing a second silicate layer on the first portion and the second portion of the plurality of components also provides the second silicate layer on the third portion of the plurality of components.

9. The method of claim 4 further comprising:
 providing a reactive metal layer on the work function layer before the step of providing the contact metal layer and before the step of performing the low temperature anneal, the step of performing the low temperature anneal being performed before the step of providing the contact metal layer; and
 removing the reactive metal layer after the step of performing the low temperature anneal and before the step of providing the contact metal layer.

10. The method of claim 9 wherein the reactive metal layer includes at least one of Si, Ti, Zr, Hf and La and has a reactive metal layer thickness of not more than four nanometers.

11. The method of claim 9 wherein the reactive metal layer resides on only a portion of the plurality of components during the low temperature anneal, the step of providing the reactive metal layer including:
 depositing a layer including a desired reactive metal; and
 removing a portion of the layer such that the reactive metal layer remains on the portion of the plurality of components.

12. The method of claim 4 wherein the work function metal layer includes at least one of TiN, TaN, TiSiN, TiTaN, WN and TiTaSiN and has a work function metal thickness of not more than three nanometers.

13. The method of claim 4 wherein the low temperature anneal has an anneal temperature of not more than six hundred degrees Celsius.

14. The method of claim 13 wherein the high dielectric constant material includes hafnium oxide.

15. A method for providing a plurality of transistors on a semiconductor device, the method comprising:
 providing a source and a drain for each of the plurality of transistors, a channel for each of the plurality of transistors, being between the source and the drain;
 providing a gate structure on the channel for each of the plurality of transistors, the step of providing the gate structure comprising
  providing an interfacial oxide layer on at least the channel;
  providing a silicate layer on the interfacial oxide layer, a first portion of the plurality of transistors having a first thickness of the silicate layer, a second portion of the plurality of transistors having a second thickness of the silicate layer, the second thickness being different from the first thickness, the step of providing the silicate layer including
   depositing a first silicate layer on the first portion and the second portion of the plurality of structures;
   removing at least a portion of the first silicate layer from the first portion of the plurality of structures; and
   providing a second silicate layer on the first portion and the second portion of the plurality of structures, each of the first silicate layer and the second silicate layer including at least one of LuSiOx, YSiOx, LaSiOx, BaSiOx, SrSiOx, AlSiOx, TiSiOx, HfSiOx, ZrSiOx, TaSiOx, ScSiOx and MgSiOx;
  providing a high dielectric constant layer on the silicate layer;
  providing a work function metal layer on the high dielectric constant layer, the work function metal layer including at least one of TiN, TaN, TiSiN, TiTaN, WN and TiTaSiN and having a work function metal thickness of not more than three nanometers;
  providing a reactive metal layer on at least a portion of the work function metal layer, the reactive metal layer including at least one of Si, Ti, Zr, Hf and La;
  performing a low temperature anneal after the step of providing the reactive metal layer, the low temperature anneal having an anneal temperature of at least two hundred degrees Celsius and not more than six hundred degrees Celsius;
  removing the reactive metal layer after the step of performing the low temperature anneal;
  providing a contact metal layer on the work function metal layer after the step of removing the reactive metal layer.

* * * * *